United States Patent
Chu et al.

(10) Patent No.: US 7,104,081 B2
(45) Date of Patent: Sep. 12, 2006

(54) CONDENSATE REMOVAL SYSTEM AND METHOD FOR FACILITATING COOLING OF AN ELECTRONICS SYSTEM

(75) Inventors: Richard C. Chu, Hopewell Junction, NY (US); Michael J. Ellsworth, Jr., Lagrangeville, NY (US); Roger R. Schmidt, Poughkeepsie, NY (US); Robert E. Simons, Poughkeepsie, NY (US)

(73) Assignee: International Business Machines Corproation, Armonk, NY (US)

( * ) Notice: Subject to any disclaimer, the term of this patent is extended or adjusted under 35 U.S.C. 154(b) by 394 days.

(21) Appl. No.: 10/812,732

(22) Filed: Mar. 30, 2004

(65) Prior Publication Data
US 2005/0217299 A1    Oct. 6, 2005

(51) Int. Cl.
*F25D 23/12* (2006.01)
(52) U.S. Cl. .................................. 62/259.2; 62/285
(58) Field of Classification Search ............... 62/259.2, 62/272, 285
See application file for complete search history.

(56) References Cited

U.S. PATENT DOCUMENTS

| | | | | |
|---|---|---|---|---|
| 3,059,446 A | * | 10/1962 | Costantini | 62/150 |
| 3,280,580 A | * | 10/1966 | Costantini et al. | 62/275 |
| 5,036,677 A | | 8/1991 | Neuenfeldt et al. | 62/259 |
| 5,694,785 A | * | 12/1997 | Balentine | 62/275 |
| 5,884,489 A | | 3/1999 | Retz et al. | 62/3.4 |
| 6,167,947 B1 | | 1/2001 | Hokanson et al. | 165/80.3 |
| 6,233,959 B1 | | 5/2001 | Kang et al. | 62/259.2 |
| 6,542,361 B1 | | 4/2003 | Paradis | 361/687 |

FOREIGN PATENT DOCUMENTS

GB     2129113 A    10/1983

OTHER PUBLICATIONS

Chu et al., "Method and Apparatus For Combined Air and Liquid Cooling Of Stacked Electronics Components", pending U.S. Appl. No. 10/303,284, filed Nov. 25, 2002.
Chu et al., "Method and System For Cooling Electronics Racks Using Pre-Cooled Air", pending U.S. Appl. No. 10/612,355, filed Jul. 2, 2002.

* cited by examiner

*Primary Examiner*—Melvin Jones
(74) *Attorney, Agent, or Firm*—Lily Neff, Esq.; Kevin P. Radigan, Esq.; Heslin Rothenberg Farley & Mesiti, P.C.

(57) ABSTRACT

System and method are provided for removing condensate from an air-to-liquid heat exchanger of a combined air/liquid enclosed apparatus for cooling rack-mounted electronic equipment. The condensate removal system includes a condensate collector for collecting liquid condensate from the air-to-liquid heat exchanger, and a vaporizing chamber in fluid communication with the condensate collector for receiving collected liquid therefrom. An actively controlled vaporizer vaporizes collected liquid within the vaporizing chamber and a vapor exhaust is in communication with the vaporizing chamber for venting vapor from the vaporizing chamber outside the cabinet containing the combined air/liquid cooling apparatus and rack-mounted electronic equipment.

20 Claims, 4 Drawing Sheets

CONDENSATE REMOVAL SYSTEM AND METHOD FOR FACILITATING COOLING OF AN ELECTRONICS SYSTEM

CROSS REFERENCE TO RELATED APPLICATIONS

This application contains subject matter which is related to the subject matter of the following applications, each of which is assigned to the same assignee as this application and each of which is hereby incorporated herein by reference in its entirety:

"Method and Apparatus For Combined Air and Liquid Cooling Of Stacked Electronics Components", Chu et al., Ser. No. 10/303,284, filed Nov. 25, 2002; and "Method and System For Cooling Electronics Racks Using Pre-Cooled Air", Chu et al., Ser. No. 10/612,355, filed Jul. 2, 2003.

TECHNICAL FIELD

The present invention relates in general to cooling assemblies and other apparatus used for removing heat from electronic devices, modules and systems. More particularly, this invention relates to systems and methods for removing condensate from an electronics cooling system, wherein the electronics cooling system could comprise an air-to-liquid heat exchanger disposed within the cabinet of rack-mounted electronic units.

BACKGROUND OF THE INVENTION

The power dissipation of integrated circuit chips, and the modules containing the chips, continue to increase in order to achieve increases in processor performance. This trend poses a cooing challenge at both the module and system level. Increased airflow rates are needed to effectively cool high power modules and to limit the temperature of the air that is exhausted into the computer center.

In many large server applications, processors along with their associated electronics (e.g., memory, disk drives, power, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPM) of an existing air moving device. However, this approach is becoming unmanageable at the frame level in the context of a computer installation (e.g., data center).

The sensible heat load carried by the air exiting the frame will eventually exceed the ability of the room air conditioning to effectively handle the load. This is especially true for large installations with "server farms" or large banks of computer frames close together. In such installations not only will the room air conditioning be challenged, but the situation may also result in recirculation problems with some fraction of the "hot" air exiting one frame being sucked into the air inlets of a nearby frame. Furthermore, while the acoustic noise level of a powerful (or higher RPM) air moving device in a single drawer may be within acceptable acoustic limits, because of the number of air moving devices in the frame, the total acoustic noise at the frame level may not be acceptable. In addition, the openings required in the frame for the entry and exit of airflow makes it difficult, if not impossible to provide effective acoustic treatment to reduce the acoustic noise level outside the frame. Finally, as operating frequencies continue to increase, we are approaching the point where electromagnetic (EMC) cross talk between tightly spaced computer frames is becoming a problem largely due to the presence of the openings in the covers required for airflow.

Recently, there has been an attempt to address some of the defects noted above by combining the air cooling approach with an air-to-water heat exchanger fixed within the server cabinet below the frame electronics. An example of such a system is Sanmina's EcoBay™ 442. The present invention builds upon prior approaches in ways that will become apparent below.

For the foregoing reasons, therefore, there is a need in the art for an improved and self-contained mechanism for cooling rack-mounted modular electronic units.

SUMMARY OF THE INVENTION

The shortcomings of the prior art are overcome and additional advantages are provided through, in one aspect, the provision of a condensate removal system for removing condensate from an electronics cooling system. The condensate removal system includes a condensate collector for collecting liquid condensate from the electronics cooling system and a vaporizing chamber in fluid communication with the condensate collector for receiving collected liquid from the condensate collector. A vaporizer is provided for vaporizing collected liquid within the vaporizing chamber, and a vapor exhaust is in gaseous communication with the vaporizing chamber for venting vapor from the vaporizing chamber outside the electronics cooling system and condensate removal system.

In another aspect, a combined air/liquid enclosed apparatus for cooling rack-mounted electronics equipment is provided. This apparatus includes a rack unit comprising a plurality of removable drawer units each containing an electronic unit, and a cabinet encasing the rack unit. An air moving device is provided for moving air within the cabinet and an air-to-liquid heat exchanger is mounted within the cabinet for cooling the air moving therein. A condensate removal subsystem removes condensate from the air-to-liquid heat exchanger. This condensate removal subsystem includes a condensate collector tray for collecting liquid condensate from the air-to-liquid heat exchanger and a vaporizing chamber in fluid communication with the condensate collector tray for receiving collected liquid from the condensate collector tray. A vaporizer vaporizes collected liquid within the vaporizing chamber and a vapor exhaust is provided in gaseous communication with the vaporizing chamber for venting vapor from the vaporizing chamber outside the cabinet.

In a further aspect, a method of removing condensate from an electronics cooling system is provided. The method includes: collecting liquid condensate from the electronics cooling system in a condensate collector; forwarding collected liquid from the condensate collector to a vaporizing chamber in fluid communication with the condensate collector; vaporizing collected liquid within the vaporizing chamber; and exhausting vapor from the vaporizing chamber to outside the electronics cooling system employing a vapor exhaust in gaseous communication with the vaporizing chamber.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronics system" comprises any housing, frame, rack, compartment, etc., containing one or more heat generating components of a computer system or other electronics unit requiring cooling. The term "electronics rack" includes any frame or rack having a heat generating component of a computer system or electronics system and may be for example, a stand alone computer processor having high, mid or low end processing capability. In one embodiment, an electronics rack may comprise multiple electronics drawers each having one or more heat generating components disposed therein requiring cooling.

Figure 1:
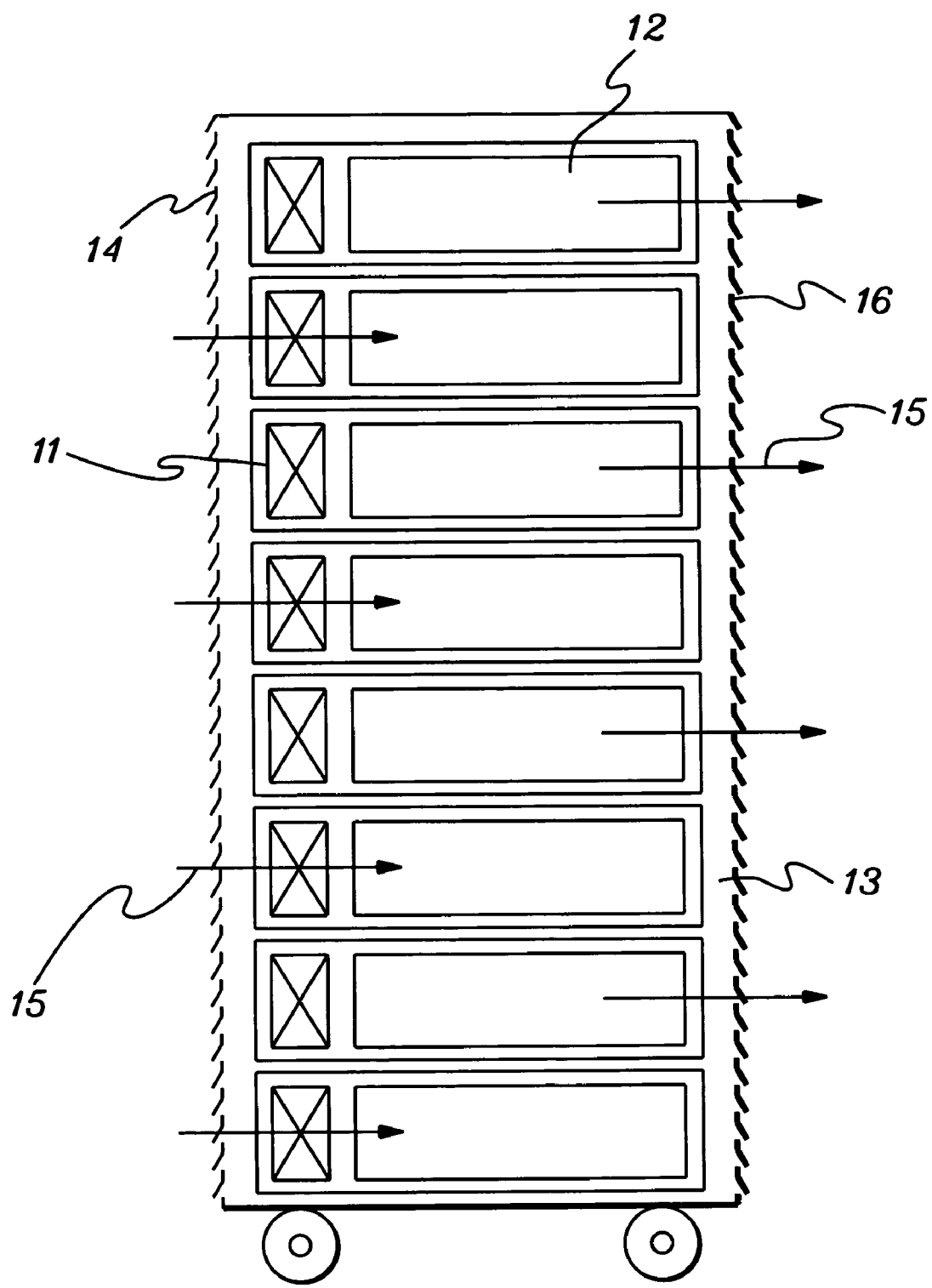
FIG. 1 depicts one embodiment of a conventional air-cooled frame with electronics in removable drawers.

As shown in FIG. 1, in rack-mounted configurations typical in the prior art, a plurality of air moving devices (e.g. fan or blower 11) provides the forced airflow 15 needed to cool the electronic components 12 within the drawer 13. Cool air is taken in through the louvered covers 14 in the front of the frame and exhausted out of the louvered covers 16 in the back of the frame.

One embodiment of the present invention uses the principle of closed air circulation heat removal and introduces an airflow configuration coupled with the placement of a heat exchanger on the side of the electronics frame; it may be preferred in that it offers the following advantages:

The side-mounted heat exchanger is not readily susceptible to accidental damage due to water leakage when service is performed.

The height of the frame is not extended. This is significant in a room with sprinkler heads less than nine feet from the floor as there is a safety specification requiring a minimum of 18 inches from the top of the frame to the sprinkler head.

Side chilled air sub-frame is shipped separately and on its own casters greatly simplifying assembly in the field.

Condensation that may be produced by the air chilling heat exchanger is well away from the electronics, and is actively eliminated.

The positioning of the heat exchanger allows for large dimensions with an associatedly large heat removal capability.

Figure 2:
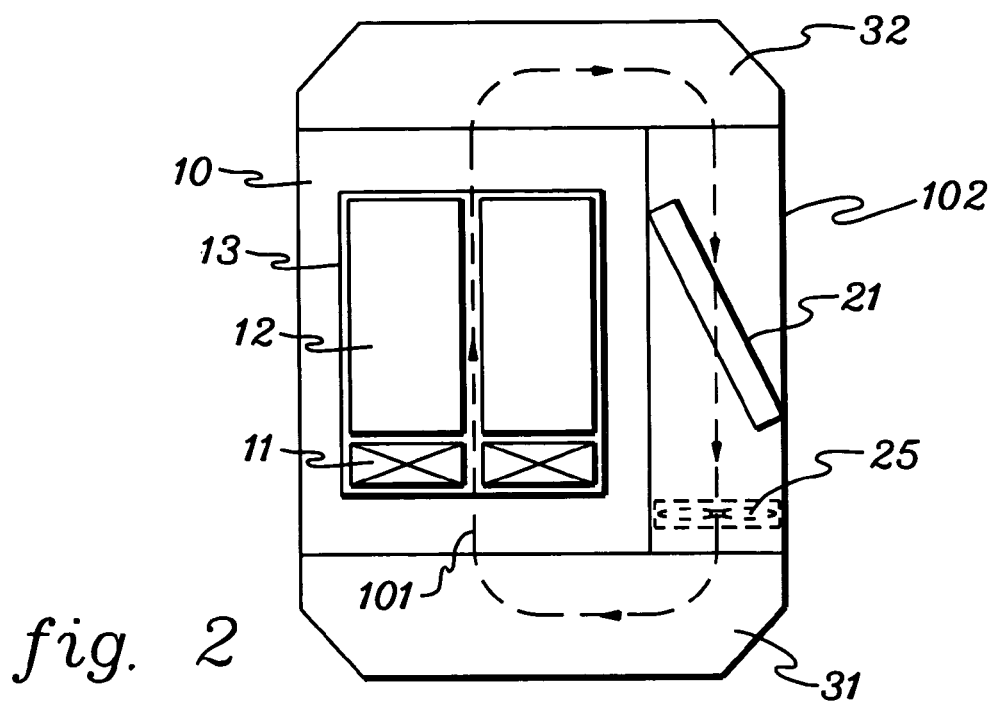
FIG. 2 is a cross-sectional top view of a horizontal closed loop airflow heat removal system for an electronics frame with a side mounted cooling system (water connections to the heat exchanger not shown), in accordance with an aspect of the present invention.

FIG. 2 shows a cross-sectional top view of one embodiment under discussion. In this embodiment, the path for the closed loop airflow 101 is horizontal in nature in that it passes from side to side. Specifically, air chilled by the heat exchanger 21 located in the side mounted chilled air sub-frame 102 is directed to the front of the electronics frame 10 within the front cover 31. Heat dissipated by the electronics 12 is transferred to the air as it passes through the electronics rack. The air is redirected into the side mounted chilled air sub-frame 102 by the back cover 32 thus completing the closed loop airflow. Air moving devices 25 may be added within the side-mounted chilled air sub-frame 102 if required to handle the additional pressure drop associated with the closed loop flow. Note that the heat exchanger 21 is positioned diagonally across the width of the sub-frame. This configuration assures the best heat transfer while minimizing air side pressure drop for a sub-frame of a given width.

Figure 3:
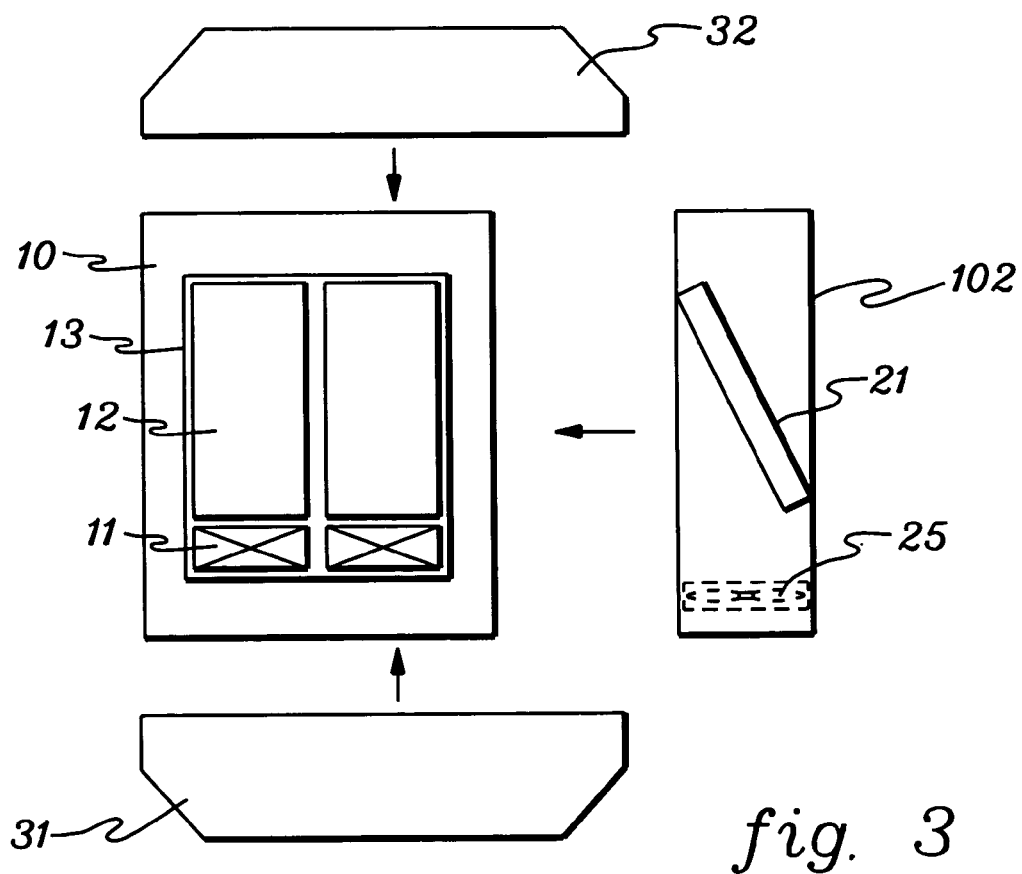
FIG. 3 is an exploded view of FIG. 2.

To emphasize the nature of the side-mounted chilled air sub-frame, an exploded top view of the frame assembly is shown in FIG. 3. Note that both the back 32 and front covers 31, as well as the chilled air sub-frame 102, may be shipped separately and assembled to the electronics frame in the field.

The liquid-to-air heat exchanger apparatus of FIGS. 2 & 3 employs, in one example, facility cooled water passing through the heat exchanger. Heat absorbed by the air is rejected to the water passing through the liquid-side of the heat exchanger, thereby reducing or even eliminating the heat load on customer air conditioning. By supplying water below room temperature, the same scheme may be used to lower the cooling air temperature within the closed loop and accommodate even higher power dissipation with air cooling than is possible today. When the water temperature entering the heat exchanger is below that of room air entering the system, however, the temperature of the water in the air-to-liquid heat exchanger may be at or below the dew point of air passing over or through the heat exchanger, resulting in water vapor in the air stream condensing on the cooler surface of a heat exchanger forming a liquid condensate.

For a well-sealed closed loop, air circuit condensation will occur upon startup but once the air has been "dried out" condensation will cease. However, it is difficult to completely seal around all the cables entering a closed system frame and it is likely that some amount of moist air is to leak into the cabinet on a continuous basis, resulting in a steady accumulation of condensate. This situation is even more serious for an open loop air cooling system with pre-cooling of air entering the frame. In this case, all the air entering into the frame is laden with moisture resulting in constant production of liquid condensate from the air passing through the water-cooled heat exchanger. One solution is to place a drip pan in the system to collect the condensate. However, because of the continuous accumulation of condensate during operation of the computer, it is necessary that the drip pan have a drain tube going to a drain in the computer room floor. This could pose a problem in that a floor drain might not always be available. Even when a floor drain is present, the risk exists that the hose from the drip pan to the drain may become dislodged discharging water onto the floor amidst the electrical cables.

Figures 4A, 4B:
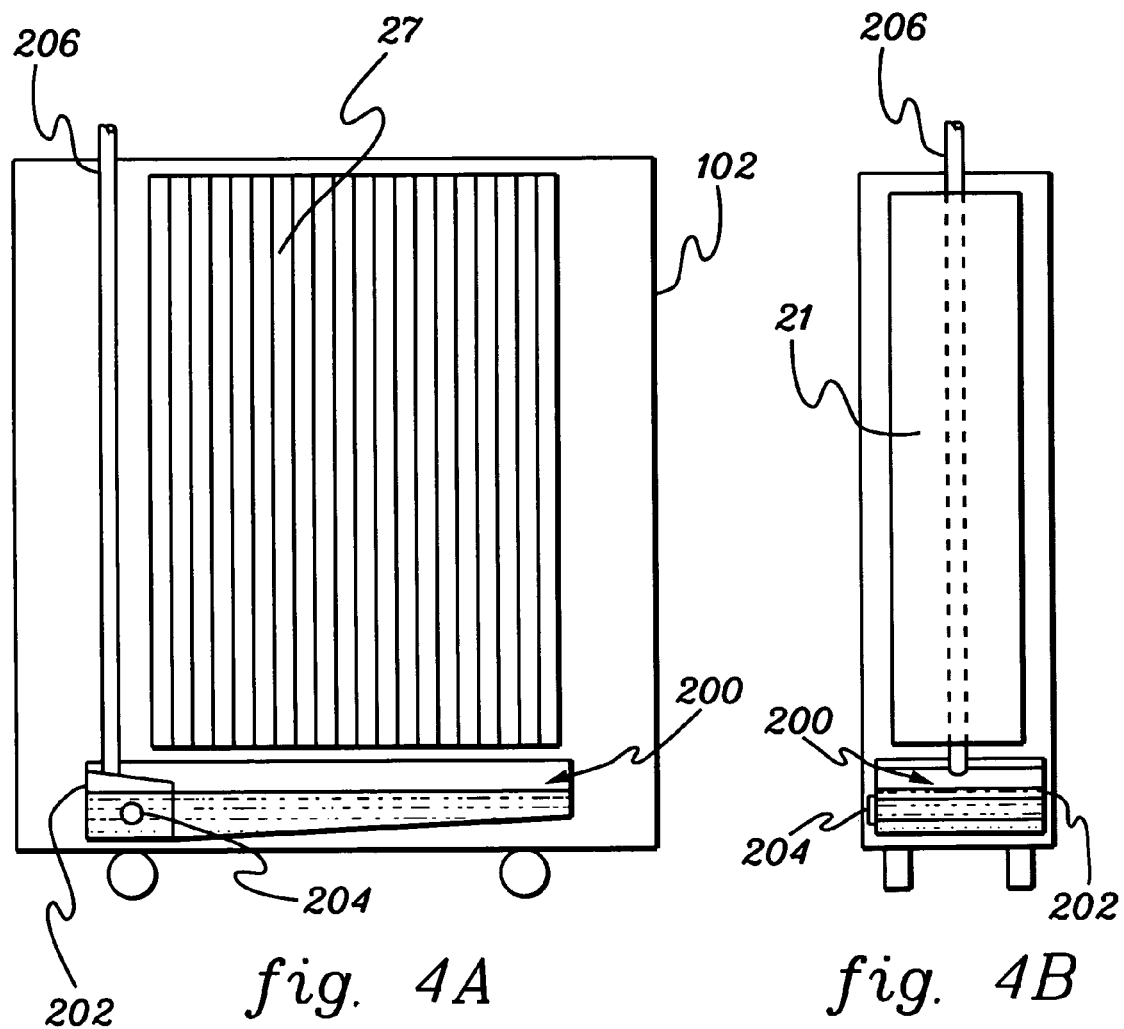
FIG. 4A is a side elevational view of one embodiment of the cooling system of FIGS. 2 & 3 and showing a condensate removal subsystem, in accordance with an aspect of the present invention.
FIG. 4B is an end elevational view of the cooling system of FIG. 4A, in accordance with an aspect of the present invention.

Disclosed hereinbelow is a condensate removal system specially designed, in one embodiment, to reside underneath an air-to-water heat exchanger 21 of a cooling system 102 producing liquid condensate. Referring to FIGS. 4A and 4B, one embodiment of the condensate removal system 200 is shown to include a condensate collector (e.g., a collection tray) 202 which is sized to reside beneath the air-to-water heat exchanger 21 of the cooling system 102. A vaporizer 204 is disposed at a first end of condensate collector 202. Vaporizer 204 provides a controllable and active means for evaporating collected condensate liquid and discharging the condensate outside the cabinet to room air in the form of water vapor. This operation is facilitated by a vapor exhaust 206 which is in communication with a vaporizing chamber and which allows water vapor to be expelled from the cabinet. The condensate removal system 200 is thus self-contained, and there is no need for a drain in the computer room floor or a discharge hose to a drain.

Figure 5:
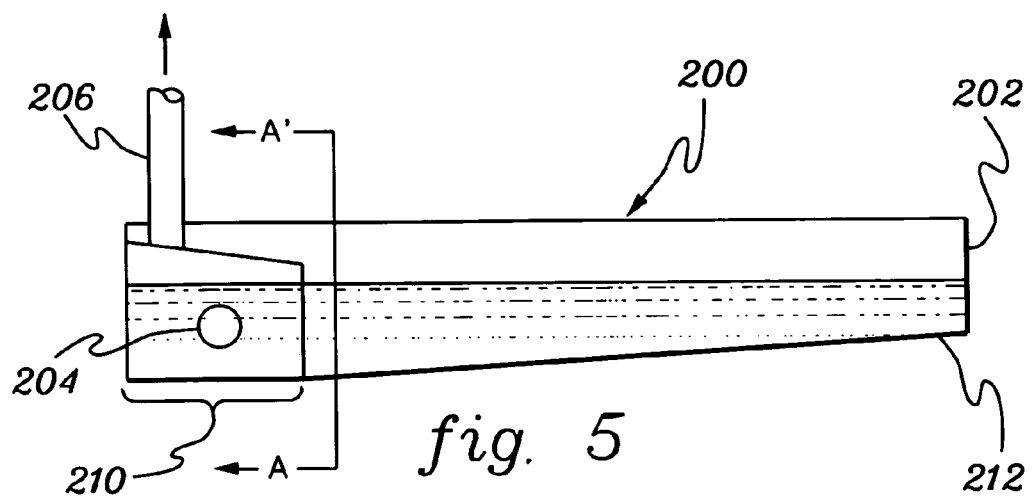
FIG. 5 is a side elevational view of one embodiment of a condensate removal subsystem for use with an electronics cooling system, in accordance with an aspect of the present invention.
Figure 6:
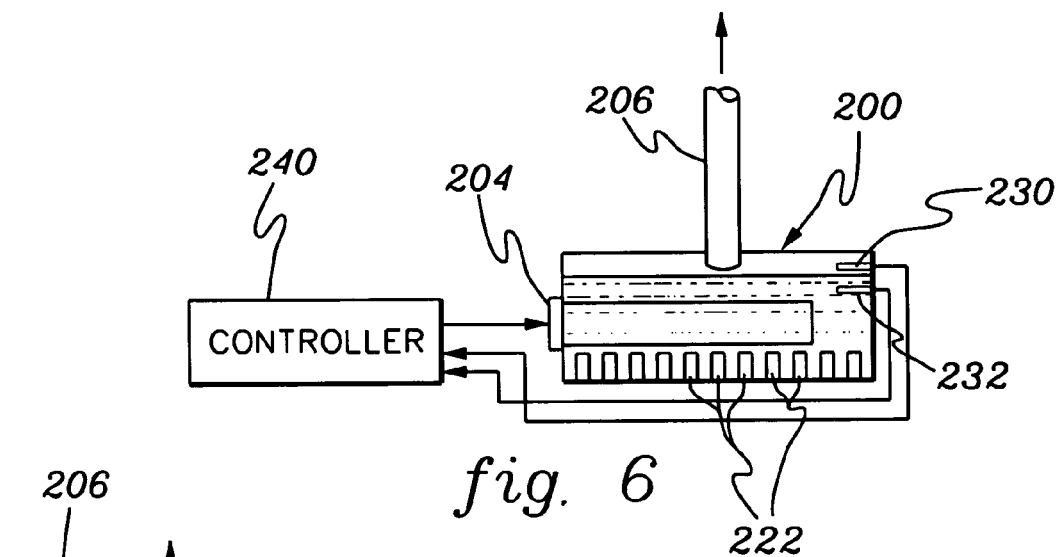
FIG. 6 is a cross-sectional view of the condensate removal subsystem embodiment of FIG. 5 taken along lines A—A' and showing liquid level sensors and a vaporizer controller, in accordance with an aspect of the present invention.
Figure 7:
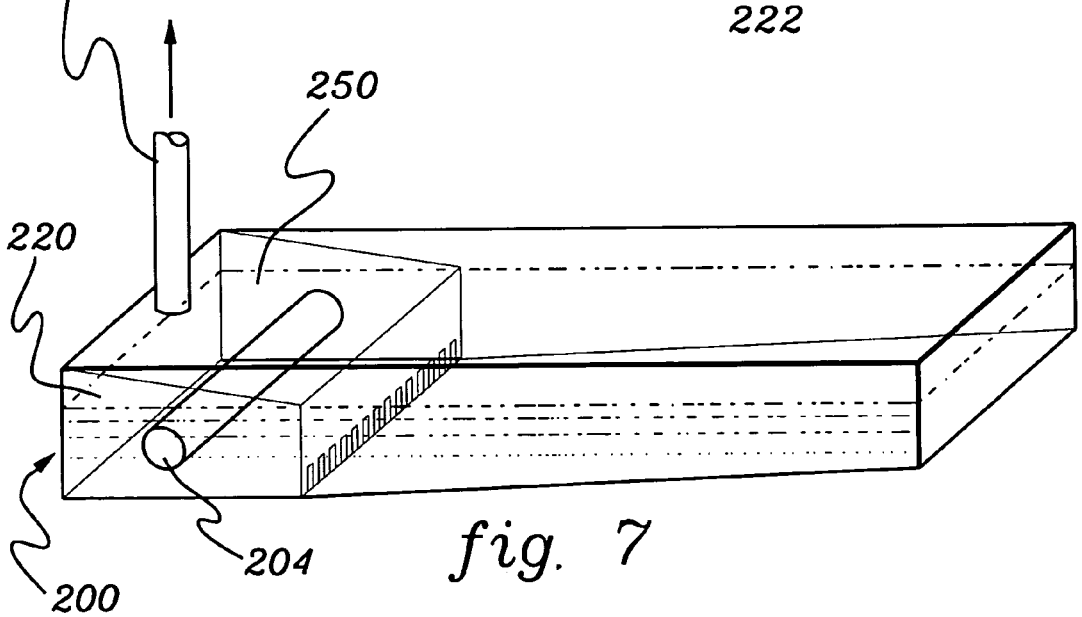
FIG. 7 is a perspective view of the condensate removal subsystem embodiment of FIGS. 5 & 6, in accordance with an aspect of the present invention.

FIGS. 5, 6 & 7 provide a more detailed example of one embodiment of condensate removal system 200, in accordance with an aspect of the present invention. FIG. 5 depicts a cross-sectional view of a portion of the condensate removal system, shown along a longitudinal axis. As shown, the condensate collector 202 is tapered from near a first end 210 to a second end 212, which allows liquid to flow from the second end towards the first end. Vaporizing chamber 220 is disposed within the condensate collector at the first, deeper end 210. As shown in the cross-sectional view A—A' of FIG. 6, slots 222 are provided at the lower end of the wall separating vaporizing chamber 220 from the remainder of the sloped section of the condensate collector 202. These slots 222, which are generally below the level of liquid condensate in the tray, allow liquid to freely flow from the sloped section of collector 202 into the vaporizing chamber 220.

Vaporizer 204 may comprise, for example, an electrical liquid heater, such as a commercially available stainless steel sheathed cartridge heater, which is sized to create enough heat within the vaporizing compartment to facilitate evaporation at the liquid-air surface interface, and also cause liquid within the vaporizing compartment on the heater surface to reach the boiling state and vaporize. Liquid vapor is exhausted through vapor exhaust 206 outside the cabinet containing the cooling system.

Operationally, as liquid condensate collects within the condensate collector tray, the liquid level rises above the level of the vaporizer 204 and eventually to the level of an upper liquid level sensor 230 (see FIG. 6). Upper liquid level sensor 230 signals a controller 240 that the liquid condensate has reached the upper level, and controller 240 activates the vaporizer 204. Boiling occurs locally on the heater surface causing vapor bubbles to form and rise to the surface within the vaporizing chamber 220. The water vapor being generated rises into the vapor exhaust 206 connected to the top wall of the vaporizing chamber. The water vapor flows through the exhaust and out into the room air via an opening situated at the top of the cabinet. As the liquid level drops within the vaporizing chamber, a second, lower liquid level sensor 232 signals the drop in condensate liquid to controller 240, which then deactivates power to vaporizer 204.

As shown in FIG. 7, the upper wall or cover 250 of vaporizing chamber 220 is sloped to allow any condensate impinging thereon to flow into the condensate collector tray 202. This design assumes that the condensate collector tray and condensate removal system have a footprint similar in length to that of the air-to-liquid heat exchanger 21 (see FIG. 4A). Alternatively, the vaporizing chamber could be disposed outside of the condensate collection tray.

Those skilled in the art will note from the above discussion that provided herein is a condensate removal system for removing condensate from an electronics cooling system through the use of an actively controlled vaporizer disposed within a vaporizing chamber. Condensate collects within a sloped tray and is fed by gravity towards the vaporizing chamber which is in fluid communication with the tray. In one embodiment, the vaporizing chamber is disposed within one end of the condensate collector tray. A controller is provided for controlling operation of the vaporizer within the vaporizing chamber to vaporize collected condensate, which is then exhausted as water vapor outside the cabinet containing the electronics cooling system and the electronics rack being cooled. Thus, condensate is removed from the cabinet without requiring the use of a liquid drain tube or the presence of a floor drain on the computer room floor.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A condensate removal system for removing condensate from an electronics cooling system, said condensate removal system comprising:
   a condensate collector for collecting liquid condensate from the electronics cooling system;
   a vaporizing chamber in fluid communication with the condensate collector for receiving collected liquid from the condensate collector;
   a vaporizer for vaporizing collected liquid within the vaporizing chamber; and
   a vapor exhaust in gaseous communication with the vaporizing chamber for venting vapor from the vaporizing chamber outside the electronics cooling system and condensate removal system.

2. The condensate removal system of claim 1, wherein a lower surface of the condensate collector is tapered from a first end towards a second end so that liquid condensate flows from the second end to the first end, and wherein the vaporizing chamber comprises a vaporizing compartment disposed at the first end of the condensate collector, the vaporizing compartment having liquid entry slots disposed in a lower portion thereof for receiving collected liquid from the condensate collector.

3. The condensate removal system of claim 1, wherein the vaporizer comprises a liquid heater, and wherein the condensate removal system further comprises at least one liquid level sensor for sensing level of collected liquid within the vaporizing chamber.

4. The condensate removal system of claim 1, further comprising a controller for automatically controlling operation of the vaporizer based on a level of liquid within the vaporizing chamber as detected by at least one liquid level sensor disposed within the vaporizing chamber.

5. The condensate removal system of claim 4, wherein the at least one liquid level sensor comprises an upper liquid level sensor for signaling the controller when an upper liquid level is reached within the vaporizing chamber, causing the controller to activate the vaporizer, and a lower liquid level sensor for signaling the controller when a lower liquid level is reached within the vaporizing chamber, causing the controller to deactivate the vaporizer.

6. The condensate removal system of claim 1, wherein the electronics cooling system comprises an air-to-liquid heat exchanger for air cooling an electronics rack and wherein the condensate collector is disposed beneath the air-to-liquid heat exchanger for collecting liquid condensate therefrom.

7. The condensate removal system of claim 1, wherein the vaporizer comprises an actively controlled vaporizer disposed within the vaporizing chamber.

8. A combined air/liquid enclosed apparatus for cooling rack-mounted electronic equipment, comprising:
 a rack unit comprising a plurality of removable drawer units each containing an electronic unit;
 a cabinet encasing the rack unit;
 an air-moving device for moving air within the cabinet encasing the rack unit;
 an air-to-liquid heat exchanger mounted within the cabinet; and
 a condensate removal subsystem for removing liquid condensate from the air-to-liquid heat exchanger, the condensate removal subsystem comprising:
  a condensate collector for collecting liquid condensate from the air-to-liquid heat exchanger;
  a vaporizing chamber in fluid communication with the condensate collector for receiving collected liquid from the condensate collector;
  a vaporizer for vaporizing collected liquid within the vaporizing chamber; and
  a vapor exhaust in gaseous communication with the vaporizing chamber for venting vapor from the vaporizing chamber outside the cabinet.

9. The apparatus of claim 8, wherein a lower surface of the condensate collector is tapered from a first end towards a second end so that liquid condensate within the condensate collector flows from the second end towards the first end, and wherein the vaporizing chamber comprises a vaporizing compartment disposed at the first end of the condensate collector, the vaporizing compartment having liquid entry slots disposed in a lower portion thereof for receiving collected liquid from the condensate collector.

10. The apparatus of claim 8, wherein the vaporizer comprises an actively controlled liquid heater disposed within the vaporizing chamber for heating collected liquid therein, and wherein the condensate removal subsystem further comprises at least one liquid sensing level sensor for sensing level of collected liquid within the vaporizing chamber.

11. The apparatus of claim 8, further comprising a controller for automatically controlling operation of the vaporizer based on a level of liquid within the vaporizing chamber as detected by at least one liquid level sensor disposed within the vaporizing chamber.

12. The apparatus of claim 11, wherein the at least one liquid level sensor comprises an upper liquid level sensor for signaling the controller when an upper liquid level is reached within the vaporizing chamber, causing the controller to activate the vaporizer, and a lower liquid level sensor for signaling the controller when a lower liquid level is reached within the vaporizing chamber, causing the controller to deactivate the vaporizer.

13. The apparatus of claim 8, wherein the condensate collector of the condensate removal subsystem is disposed beneath the air-to-liquid heat exchanger, the vaporizing chamber is disposed within the condensate collector and the vaporizing chamber has a cover sloped to direct condensate impinging on the cover into the condensate collector.

14. A method of removing condensate from an electronics cooling system, the condensate removal method comprising:
 collecting liquid condensate from the electronics cooling system in a condensate collector;
 forwarding collected liquid from the condensate collector to a vaporizing chamber in fluid communication with the condensate collector;
 vaporizing collected liquid within the vaporizing chamber; and
 exhausting vapor from the vaporizing chamber to outside the electronics cooling system employing a vapor exhaust in gaseous communication with the vaporizing chamber.

15. The method of claim 14, wherein a lower surface of the condensate collector is tapered from a first end towards a second end so that liquid condensate flows from the second end to the first end, and wherein the vaporizing chamber comprises a vaporizing compartment disposed at the first end of the condensate collector, the vaporizing compartment having liquid entry slots disposed in a lower portion thereof, and wherein the forwarding comprises forwarding by gravity collected liquid within the condensate collector to the vaporizing compartment via the liquid entry slots.

16. The method of claim 14, wherein the vaporizing comprises employing a liquid heater disposed within the vaporizing chamber, and wherein the method further comprising sensing a level of collected liquid within the vaporizing chamber.

17. The method of claim 14, wherein the vaporizing comprises employing a vaporizer, and wherein the method further comprises automatically controlling operation of the vaporizer based on a level of liquid within the vaporizing chamber.

18. The method of claim 17, wherein the level of liquid within the vaporizing chamber is sensed by an upper level liquid sensor and a lower level liquid sensor, wherein the automatically controlling comprises activating the vaporizer when liquid within the vaporizing chamber reaches the upper liquid level, and deactivating the vaporizer when liquid within the vaporizing chamber falls below the lower liquid level.

19. The method of claim 14, wherein the electronics cooling system comprises an air-to-liquid heat exchanger for air cooling an electronics rack, and wherein the collecting comprises disposing the condensate collector beneath the air-to-liquid heat exchanger for collecting liquid condensate therefrom.

20. The method of claim 14, wherein the vaporizing comprises employing a vaporizer disposed within the vaporizing chamber, and wherein the method further comprises actively controlling operation of the vaporizer to remove collected liquid from the vaporizing chamber.

* * * * *